US011041885B2

(12) United States Patent
Sterzbach (10) Patent No.: US 11,041,885 B2
(45) Date of Patent: *Jun. 22, 2021

(54) ELECTRICAL MEASUREMENT OR INSPECTION APPARATUS, PLUG CONNECTION FOR A MEASUREMENT OR INSPECTION APPARATUS AND METHOD FOR SETTING AN ELECTRICAL MEASUREMENT OR INSPECTION APPARATUS (71) Applicant: Rohde & Schwarz GmbH & Co. KG, Munich (DE)

(72) Inventor: Bernhard Sterzbach, Munich (DE)

( * ) Notice: Subject to any disclaimer, the term of this patent is extended or adjusted under 35 U.S.C. 154(b) by 162 days.

This patent is subject to a terminal disclaimer.

(21) Appl. No.: 16/116,691

(22) Filed: Aug. 29, 2018

(65) Prior Publication Data
US 2019/0113543 A1  Apr. 18, 2019

(30) Foreign Application Priority Data
Oct. 12, 2017 (DE) .......................... 102017218220.2

(51) Int. Cl.
G01R 15/12 (2006.01)
G01R 1/02 (2006.01)
G01R 1/04 (2006.01)
G01R 31/60 (2020.01)
G01J 3/46 (2006.01)
H01R 13/46 (2006.01)
(Continued)

(52) U.S. Cl.
CPC ............ *G01R 15/125* (2013.01); *G01J 3/463* (2013.01); *G01R 1/025* (2013.01); *G01R 1/0416* (2013.01); *G01R 31/60* (2020.01); *H01R 13/465* (2013.01); *G01J 3/46* (2013.01); *G01J 2003/466* (2013.01); *G01R 13/0227* (2013.01); *G01R 31/2834* (2013.01); *H01R 43/26* (2013.01)

(58) Field of Classification Search
CPC ...... G01R 31/60; G01R 1/025; G01R 1/0416; G01R 31/66; G01J 3/463; G01J 3/46
See application file for complete search history.

(56) References Cited

U.S. PATENT DOCUMENTS 4,731,663 A * 3/1988 Kovalchick ............ G01R 31/60
  382/165
4,915,639 A * 4/1990 Cohn ................. G06K 7/10861
  439/188

(Continued)

FOREIGN PATENT DOCUMENTS

DE   102011080481 A1   2/2013
EP       0644428 A2    9/1994
(Continued)

OTHER PUBLICATIONS

Extended Search Report from counterpart European Application No. 18188491.7, dated Jun. 14, 2019, 13 pp.
(Continued)

*Primary Examiner* — Dominic J Bologna (57) ABSTRACT

The present invention relates to a measurement or inspection apparatus which can be adjusted depending on a color of a plugged-in cable. In this manner the display of measurement values and the colour of the plugged-in cable can be coordinated to each other such that a simple assignment between measurement values and cable can be performed.

7 Claims, 4 Drawing Sheets

(51) Int. Cl.
*G01R 31/28* (2006.01)
*H01R 43/26* (2006.01)
*G01R 13/02* (2006.01)

(56) References Cited

U.S. PATENT DOCUMENTS

| | | | | |
|---|---|---|---|---|
| 5,570,191 | A * | 10/1996 | Uesugi | G01J 3/02 |
| | | | | 250/226 |
| 5,629,615 | A * | 5/1997 | Nita | G01R 13/202 |
| | | | | 324/121 R |
| 5,709,025 | A * | 1/1998 | Wuyts | G01R 31/60 |
| | | | | 29/748 |
| 6,437,552 | B1 | 8/2002 | Sekel et al. | |
| 8,004,273 | B1 | 8/2011 | McKinley et al. | |
| 10,288,410 | B2 * | 5/2019 | Hoffmann | H01R 43/20 |
| 2012/0210026 | A1 * | 8/2012 | Schwenk | H01R 13/7039 |
| | | | | 710/33 |
| 2017/0034597 | A1 * | 2/2017 | Shih | H01R 24/64 |
| 2019/0318845 | A1 * | 10/2019 | Wang | H01B 7/368 |

FOREIGN PATENT DOCUMENTS

| | | |
|---|---|---|
| EP | 3056915 A1 | 8/2016 |
| JP | H0433270 | 2/1992 |

OTHER PUBLICATIONS

Communication pursuant to Rule 69 EPC and 70a(1) EPC from counterpart European Application No. 18188491.7, dated Jul. 22, 2019, 2 pp.
Response to Extended Search Report dated Jun. 14, 2019 and Communication pursuant to Rule 69 EPC dated Jul. 22, 2019, from counterpart European Application No. 18188491.7, filed Jan. 14, 2020, 16 pp.
"Colour, contrast and luminescence sensors," Sensopart, Jun. 14, 2017, accessed from https://web.archive.org/web/20170614134756if_/http://www.sensopart.com/jdownloads/Gesamtkatalog/Colour_contrast_luminescence_sensors_e.pdf, retrieved on Apr. 9, 2019, 32 pp.
Search Report from counterpart European Application No. 18188491.7, dated Mar. 11, 2019, 17 pp.

* cited by examiner

ELECTRICAL MEASUREMENT OR INSPECTION APPARATUS, PLUG CONNECTION FOR A MEASUREMENT OR INSPECTION APPARATUS AND METHOD FOR SETTING AN ELECTRICAL MEASUREMENT OR INSPECTION APPARATUS

TECHNICAL FIELD

The present invention concerns an electrical measurement or inspection apparatus, a plug connection for connecting to an electrical measurement or inspection apparatus as well as a method for setting an electrical measurement or inspection apparatus.

Although the present invention can be employed for an arbitrary electrical measurement or inspection apparatus, the underlying problem will be explained hereinafter with reference to an electrical measurement device.

In the electrical engineering field numerous tests need to be carried out for the inspection or maintenance of electrical components. In many cases such tests require an electrical connection between an inspection object (object to be to inspected) and a measurement device. These electrical connections are usually established by means of cable connections. For avoiding errors and for simplifying the layout and overview, cables with different colors, for example with a colored insulation and/or colored plug connectors, may be employed.

In addition, many measurement devices allow the display of detected measurement values or progress/waveforms of detected measurement values in different colors. If necessary, a user can manually adapt the respective color for the display. Herein the user himself/herself is responsible for the assignment of the respective colors for the measurement values on the display of the measurement device.

For increasing the layout/overview and for a fast detection of the measurement values an automatic assignment between the color of the connected cables and the display of the measurement values on the measurement device is desirable.

SUMMARY OF THE INVENTION

For this purpose, the present invention provides an electrical measurement or inspection apparatus having the features of claim 1, a plug connection having the features of claim 8 as well as a method for setting an electronic measurement or inspection apparatus having the features of claim 10.

Accordingly, there is provided:

An electrical measurement or inspection apparatus having a connector device and a color detector. The connector device of the measurement or inspection apparatus is configured to be coupled with a cable or an inspection object. In particular, the coupling may be performed mechanically and electrically. The color detector is configured to detect a color at a predetermined position of the cable or the inspection object coupled with the connector device.

Furthermore, there is provided:

A plug connection for connecting to an electrical measurement or inspection apparatus. The plug connection includes a connection element and a cover element. The connection element has a first color at a first predetermined position. Furthermore, the connection element can have a second color at a second predetermined position. The cover element is arranged movably at the connection element. In particular, the cover element is configured to cover either the first color at the first position or the second color at the second position.

Finally, there is provided:

A method for setting an electrical measurement or inspection apparatus. The method includes a step for detecting a color of a cable or inspection object coupled with the measurement or inspection apparatus. Furthermore, the method includes a step for setting the measurement or inspection apparatus dependent on the detected color.

The present invention is based on the finding that for increasing the clarity for measurement or inspection operations, normally different colors can be used for assigning different measurement points. Accordingly, the measurement results can also be displayed with different colors at a measurement device. Herein, an automatic assignment between the color of the displayed measurement values and the color codings in the measurement or inspection environment is desirable.

The present invention is based on the idea to account for this finding and to automatically detect a color in the connection region of the measurement or inspection apparatus when connecting a cable or when directly connecting an inspection object to a measurement device. Subsequently, by using such a detected color, automatic adjustments of the measurement and inspection apparatus can be carried out. In this manner on the one hand the user is relieved from a manual assignment between connected cables and settings in the measurement or inspection apparatus, and on the other hand it can be ensured that possible sources of errors by the user can be avoided on the basis of the automatic assignment.

The electrical measurement or inspection apparatus may be an arbitrary apparatus, which is used for measurement or inspection purposes. For example, it may be an electrical measurement device such as a voltage measurement device, a current measurement device or similar. In particular, also so-called multimeters are possible, which allow in one device the measurement of several electrical parameters such as current, voltage, frequency, resistance et cetera. Furthermore, also measurement devices such as an oscilloscope are possible, which can sense a temporal waveform or progress of one or several electrical parameters and which can display this temporal waveform/progress. In addition, also arbitrary further electrical measurement devices for detecting one or more electrical parameters are possible.

It is self-evident that the respective measurement device is not limited to the detection of electrical parameters in only one channel. Moreover, obviously also measurement devices are possible which have an arbitrary number of one or more connectors or terminals for the detection of electrical parameters. In this manner, electrical parameters at several connectors or terminals of the measurement device can be detected for example simultaneously or successively. Herein, respective equal or similar but also different electrical parameters like current, voltage, frequency et cetera can be detected at different connectors.

The electrical measurement or inspection apparatus can automatically detect the color of a connected element, such as a plug, a cable or similar, by means of a color detector. If needed, also an object to be inspected can be connected directly to a connector or terminal of the measurement or inspection apparatus. In this case a color can be detected also directly at the connected object.

The detection of the color can be carried out by means of a spectral analysis of wavelengths in the visible region. In particular, wavelengths in the range between 400 nanometer (nm) to 800 nm can be evaluated. However, basically also an analysis of spectral regions in the ultraviolet wavelength range and/or in the infrared wavelength range is possible. In particular, it is possible to detect and evaluate a predetermined wavelength region completely, that is to analyze a continuous spectrum within a predetermined wavelength range. It is, however, also possible to select only single fixed predetermined wavelengths or colors corresponding to these wavelengths and to determine possible colors at the connection/terminal of the measurement or inspection apparatus based thereon.

However, not only such apparatuses are considered as measurement or inspection apparatus which detect electrical signals or determine a corresponding measurement value, but also such apparatuses which provide an output signal required for a measurement or inspection operation. For example, a measurement or inspection apparatus can also comprise a voltage or current source, a signal generator or similar. Moreover, arbitrary further measurement or inspection apparatuses which can generate and provide electrical signals are possible.

Further embodiments of the present invention are the subject of the dependent claims and the following description in connection with the respective drawings.

In a possible embodiment the measurement or inspection apparatus comprises a control device. The control device can be configured to adapt/adjust, by using the color detected by the color detector, a setting in the measurement or inspection apparatus.

The adaption or adjustment of the settings can relate not only to the illustration/display of the measurement results but also to the configuration of the measurement and inspection apparatus. Thus, it is for example possible that a specific color corresponds for example to a predetermined channel in the measurement or inspection apparatus. In this manner, a cable with a predetermined color or a connector with a predetermined color can be plugged into an arbitrary connector/terminal and the same color will be automatically assigned respectively to the corresponding channel. This allows a significant higher flexibility when connecting the measurement or inspection apparatus, in particular for complex configurations.

Herein, the color to be detected can be detected at an arbitrary predetermined position of the connector device of the measurement or inspection apparatus. For example, the end face of a connector can be color-coded. Moreover, the color can also be detected at the side of the connector or at an arbitrary other position of the connector or the cable. In particular, it is also possible to detect the color in the interior region of the connector. Since the interior region of the connector is specially protected, normally only very few damages or contaminations occur there such that a reliable detection of the color is possible at this position.

In a possible embodiment the measurement or inspection apparatus comprises a display device. The display device can be configured to display a measurement value. Herein, the control device can be configured to adapt the displayed measurement value dependent on the detected color.

By adapting the color on a display of the measurement or inspection device to a color at the connector of the measurement or inspection apparatus an automatic assignment between the detected measurement values and the displayed measurement values can be carried out. The user can thus swiftly and reliably identify the association between the displayed measurement values and the respective connector (terminal). For example, a measurement value can be displayed on the display device in the same color which has been detected by the color detector at the respective connector device. The adaption of the color can for example include the display of the respective measurement value in the corresponding color, the inclusion of a colored background of the respective measurement value or the framing of the measurement value with a corresponding color. Furthermore, there are arbitrary further possibilities for adapting the color of a displayed measurement value. Thus, for temporal waveforms to be displayed, for example waveforms such as those which are displayed by an oscilloscope or similar, the corresponding waveform can be displayed in the respective color which corresponds to the color detected by the color detector.

In a possible embodiment the measurement or inspection apparatus comprises a measurement device. The measurements device is configured to detect an electrical parameter of a measurement object coupled to the connector device. Hereby, the control device can be configured to set the measurement device dependent on the detected color.

The setting or adjusting of the measurement device by using the detected color can hereby comprise the setting of an arbitrary parameter in the measurement device. For example, by detection of the color a possible polarity of the applied signal can be deducted. In this manner possible errors, for example when exchanging the polarity, can be avoided.

Moreover, different colors can for example also be assigned to different properties to be detected. For example, a first color may be assigned to a voltage measurement, a second color to a current measurement, a third color to a frequency measurement and so on. Furthermore, it is also possible that different colors are assigned to different value ranges, such that dependent on the detected color accordingly a value region to be detected can be set. Furthermore, it is also possible that the respective color provides an information on the connected component. For example, when connecting a sampling probe to an oscilloscope, a possible divider ratio of the connected sampling probe can be determined by using the detected color. Furthermore, evidently also arbitrary further configurations of the measurement or inspection apparatus, in particular of a measurement device, are possible by using the detected color.

In a further embodiment, the control device is configured to output an error message, when the detected color does not coincide with/match a predetermined color.

For example, if one or more connector devices of the measurement or inspection apparatus are assigned specific properties, such as a determined polarity or similar, an inspection of the color of the cable or connector connected to such a connector device can identify a correct connection. For example, connectors for a positive polarity can only then be enabled, if the corresponding color, for example red, is detected at the respective connector. For a ground connector or a connector with a negative polarity, the detection of a blue or black color can be required. Obviously, arbitrary further specifications or rules for inspecting colors at a connection device are possible. If a correct specified color is detected, the respective connector can be enabled. In particular, a measurement can be activated or a generated test signal can be output when a correct color is detected. Furthermore, it is possible to output a corresponding optical, acoustic or other error message when detecting a color which does not correspond to a predetermined color.

In a possible embodiment the color detector comprises a light source and an optical detector.

The light source can for example be a light source which emits optical light in the visible wavelength region. Furthermore, the light source can also emit infrared and/or ultraviolet light. The light source can emit light in a predetermined wavelength spectrum. Furthermore, it is also possible that the light source emits only light with one or more predetermined wavelengths. The optical detector can be configured to detect and evaluate the light which has been emitted by the light source and has been reflected by an object at the input connector. For example, the detector can be a detector which evaluates light in a predetermined wavelength spectrum, for example in the visible wavelengths region, and in addition alternatively also in the ultraviolet wavelength range or in the infrared wavelength range. In this case, light can be emitted by the light source in a predetermined wavelength spectrum. Alternatively, it is also possible that the light source emits a temporal sequence of light signals with different wavelengths. In this case the optical detector can respectively detect the intensity of light which has been reflected by an object at the connector device and can determine a possible color of the object at the input connector based on the association between the detected intensity and the respective corresponding wavelength of the light emitted by the light source. As light sources, arbitrary light sources, in particular for example light sources on the basis of light emitted by diodes or similar, can be used. Furthermore, also an arbitrary suitable optical detector can be employed, for example a detector on the basis of semiconductor elements.

In a possible embodiment the measurement or inspection apparatus comprises a signal device. The signal device can be configured to output an optical signal. In particular, the signal device may be configured to set the optical signal dependent on the color detected by the color detector.

The signal device can be for example a display, for example a lighting element, which lights up dependent on the detected color and/or adapts the displayed color. For example, the signal device can output respectively an optical signal in a color which corresponds to the detected color. In this manner, a user can simply and reliably determine, whether the correct color has been detected by the color detector. Moreover, it is also possible that the signal device only outputs a signal when detecting one or several predetermined colors. For example, the signal device can light up in a arbitrate color, in particular white, if a predetermined color or an arbitrary color has been detected by the color detector. If the color detector cannot perform a detection of a color or cannot perform a correct detection of a predetermined color, the signal device may display an error. In this case, an optical signal may for example not be output, or during an error condition a first color, for example red, is displayed, whilst with a correct detection a second color, for example green, is displayed.

For the connection of the connector device to the measurement or inspection apparatus a plug connector with several colors may be provided. In particular, in such a case a cover element may for example respectively expose only one of several colors, whilst the cover element covers the remaining colors at the plug connector. In this manner, a variable color-coding of the connector can be achieved by adapting the cover element. For example, the cover element can be moved, by rotation, by shifting or similar, to respectively expose only one of several colors.

In a possible embodiment the connector can further comprise a locking element. The locking element can be mechanically coupled with the cover element. In this case, the cover element can in particular be configured to cover a first color when the locking element is in a first position. Furthermore, the cover element may be adapted to cover the second color at the second position, when the locking element is in a second position.

The above configurations and further adaptions can be, in as far as this is useful, combined arbitrarily with respect to each other. Further configurations, embodiments and implementations of the invention comprise also not explicitly referred to combinations of the features of the invention described above or with reference to the embodiments hereinafter. In particular, the skilled person will add herein also single aspects as improvements or supplements to the respective basic construction of the invention.

BRIEF DESCRIPTION OF THE DRAWINGS

The present invention is hereinafter explained in detail with reference to the attached drawings of the embodiments shown in the drawings. In the drawings:

FIG. 4 shows a flowchart, such as one which a method for setting a measurement or inspection apparatus in accordance with an embodiment is based on.

EMBODIMENTS OF THE INVENTION

In the figures, the same numerals refer to the same or functional equivalent elements and apparatuses unless otherwise stated.

Figure 1:
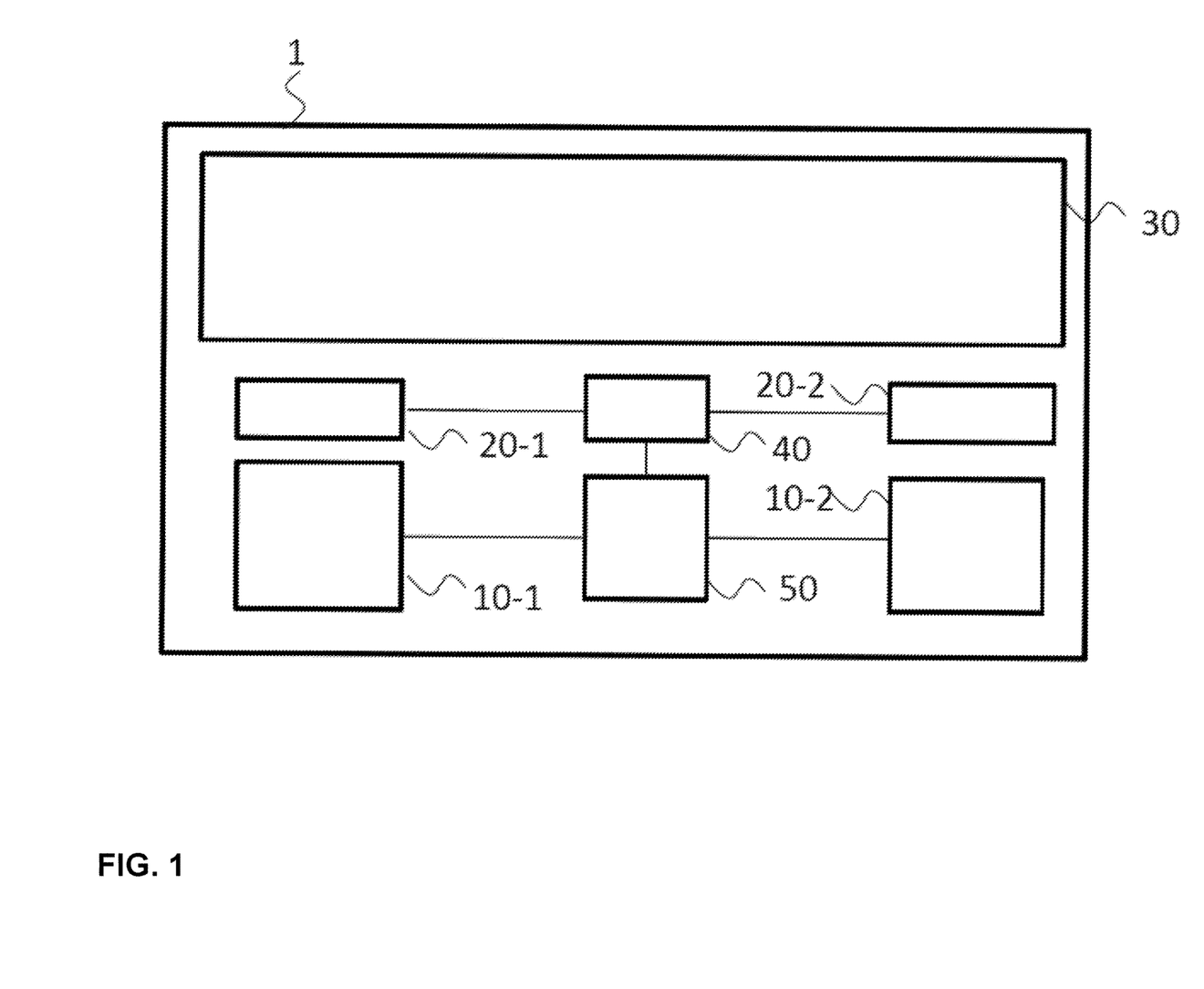
FIG. 1 shows a schematic illustration of a block diagram of a measurement or inspection apparatus in accordance with one embodiment.

FIG. 1 shows a schematic illustration of an electrical measurement or inspection apparatus in accordance with one embodiment. The measurement or inspection apparatus 1 comprises a plurality of one or more connector devices 10-$i$. To each of these connector devices 10-$i$ a cable or an electrical conductor can for example be connected. For this, the connector device 10-$i$ can include for example a suitable socket or a suitable plug, where the cable or the conductor may be connected. Furthermore, also a direct connection of the measurement object to the measurement device 50 is possible. The connector device 10-$i$ can for example exhibit a female socket, for example a socket with a 4 mm connector (banana socket). Furthermore, also BNC-connectors or arbitrary other suitable connectors are possible. The connector device 10-$i$ can in particular provide a unipolar or multipolar connector. Hereby, the connector device is not limited to the previously described possibilities. Quite to the contrary, arbitrary other terminals or connectors may be provided, to connect a cable or a measurement object. Hereby, the connector device 10-$i$ can provide an electrical as well as mechanical coupling with the cable of the inspection object.

Further there may be one color detector 20-$i$ for each connector device. The color detector 20-$i$ can for example be arranged in close proximity to the corresponding connector device 10-$i$. The color detector 20-$i$ can hereby be arranged on the exterior of the measurement or inspection apparatus 1 in a housing. However, it is also possible that the color detector 20-$i$ is arranged internally in the measurement or inspection apparatus 10-$i$.

In the following description it is assumed that a plug connector of a cable can be inserted or plugged into a connector device 10-$i$. As mentioned before, however, the present invention is not limited to a connection by inserting a plug but furthermore also arbitrary other possibilities are possible for electrically and mechanically coupling a cable or an inspection object with the connector device 10-*i*.

After plugging in the plug into a connector device 10-*i* the color detector 20-*i* corresponding thereto can detect the color of the cable or the plugged in plug at a predetermined position. The detailed operation of the color detector 20-*i* will be explained below with further details.

The color detector 20-*i* can for example detect the color of a plastic insulation of the plugged in cable. Alternatively, also the detection of the color of a plug, in particular of a plastic insulation of the plug, is possible. Herein, the color on an end face of a plug contact plugged into the connector means 10-*i* can be detected. Furthermore, it is also possible to detect the color at an arbitrary predetermined outer position of the plug contact by the color detector 20-*i*.

For example, the plug contact which has been plugged into the connector device 10-*i* can have a uniform, possibly insulating, coating which is colored with a predetermined color. It is, however, also possible to specifically attach a colored marking at a predetermined position of the plug. For example, for this purpose an adhesive sticker with a predetermined color can be adhered on the plug. Furthermore, it is also possible that the plug has for example a recess, an indentation or an opening in which a characterizing element with a predetermined color, for example a plastic element or similar, can be attached. Furthermore, also the attachment of a further marking or labelling with a predetermined color is possible, for example via adhesion, pressing or similar. Furthermore, a colored marking can be attached to a predetermined position of the plug also for example by means of a suitable color pen. Of course, also other arbitrary possibilities for color marking can be used.

Upon detection of a color of an element at the connector device 10-*i* by the color detector 20-*i*, the function of the measurement or inspection apparatus 1 can be adapted or set based thereon.

For example, if no color is detected by the color detector 20-*i*, then this can be an indication that no cable is plugged in at the connector device 10-*i*. In this case the corresponding connection of the corresponding connector device 10-*i* can be deactivated, if no color has been detected. Analogously, the connection of the corresponding connector device 10-*i* can be activated upon detection of the color of the connection. The activation of the respective connection can in particular also be limited to one or more predetermined colors. In other words, the connection of the connector device 10-*i* will only be activated if one or more predetermined colors have been detected by the color detector 20-*i*. Otherwise the corresponding connection will be deactivated.

In this manner it can be ensured that a not used connection will be deactivated. Furthermore, possible malfunctions as a result of incorrect connections or a similar can be avoided. If for example a cable with a color for a negative polarity is connected at a connection for a signal with a positive polarity, then the corresponding connection can be deactivated to avoid errors or damages.

Furthermore, it is also possible to adapt the configuration of the measurement or inspection apparatus 1 dependent on the detected color of the connector device 10-*i*. If for example a cable with a color for a positive polarity is detected at a connection, then a positive output signal can be provided at the corresponding connection. When detecting a cable with a color for a negative polarity, correspondingly a measurement or inspection signal with a negative polarity can be output. Furthermore, it is also possible to adapt the configuration of the measurement or inspection apparatus according to the detected color of the connector device 10-*i*. Herein, the measurement or inspection apparatus 1 can be correspondingly configured when detecting a cable with a color which is provided for a positive polarity.

Furthermore, it is also possible to determine the functionality of a connected component based on the detection of a predetermined color at the connector device 10-*i*. If for example a correspondingly color-coded cable with a sampling probe is connected to an oscilloscope, the respective sampling probe or respectively the sampling ratio set therein can be determined automatically by using the detected color of the connected cable. Furthermore, further parameters, for example a bandwidth, a frequency waveform or similar can be determined. Thereafter, the measurement or inspection apparatus 1 can be automatically set in accordance therewith.

For controlling the functions for the configuration and setting of the measurement or examination apparatus 1, a control apparatus 40 can be provided in the measurement or inspection apparatus 1. By using a color detected by the color detector 20-1 this control device 40 can adapt or adjust one or more settings in the measurement or inspection apparatus 1. Herein the configuration of the measurement or inspection apparatus by the control device 40 is, however, not limited to the above described examples. Much rather, an arbitrary adjustment of the measurement or inspection apparatus 1 by the control device 40 dependent on the detected color at the connector device 10-*i* is possible.

For example, the measurement or inspection apparatus 1 can include a measurement device 50. This measurement device 50 can sense for example an electrical parameter, for example a voltage, current, a frequency, a resistance, and impedance or any arbitrary further electrical parameter of the measurement object coupled with the connector device 10-*i*. Herein, the measurement device 50 can be set by the control device 40 dependent on the color detected at the respective connector device 10-*i*.

For example, cables with a specific color or at least with a specific color coding of a plug for specific measurement or inspection operations may be provided. For example, there may be provided a cable with a first color for a voltage measurement and a cable with a second color may be provided for a current measurement. Furthermore, based on the color, a possible frequency response or an impedance of the cable can for example be determined. Hence, based on a detected color of an element connected at the respective connector device 10-*i*, a suitable setting of the measurement or inspection apparatus, in particular of the measurement device 50, can be automatically determined and the measurement device 50 can be set and configured in accordance therewith.

The measurement or inspection apparatus 1 can furthermore include also a display device 30 for a display of the measurement values and/or measurement value waveforms. The display device 30 can for example include a color screen or similar. In this manner the display of alphanumeric data for illustrating measurement values or if needed also the display of inspection signals provided at the respective connector device 10-*i* are for example possible. Furthermore, also graphic illustrations of detected measurement values and/or of output inspection signals may be displayed on the display device 30. For example, also temporal waveforms in the form of curve waveforms as detected and displayed by an oscilloscope or similar, can be reproduced on the display device 30.

Especially when the measurement or examination apparatus 1 includes several connector devices 10-$i$, several electrical signals can be detected and/or output by the measurement or inspection apparatus 1. To allow a simple assignment or association of the displayed values to the respective connector devices 10-$i$, the respective values may be displayed in different colors. For this, the colors of the values displayed on the display device 30 can be adjusted in accordance with the detected colors at the connector devices 10-$i$. In particular, the values displayed in the display device 30 can be displayed in the same color which the color detector corresponding to the respective connector device 10-$i$ has been detected. In this manner it is possible for a user to identify an association between the displayed values and the respective connections very quickly and in a simple manner. In particular, also when exchanging the leads at the connector devices 10-$i$, always a suitable association between the displayed values and the connected leads is possible.

For checking a correct detection of the color by the respective color detector 20-$i$ a signal device (not illustrated) can be provided in spatial proximity to the connector devices 10-$i$ or the color detectors 20-$i$. This signal device can for example output an optical signal which depends on the color detected by the respective color detector 20-$i$. For example, the signal device can output an optical signal in a color which corresponds to the color detected by the respective color detector 20-$i$. Furthermore, it is also possible that the signal device outputs a signal in a first color when detecting one or more predetermined colors and otherwise outputs a signal in a second color or possibly also no optical signal. In this manner, the user can very simply check the correct operation of the color detector 20-$i$.

Figure 2:
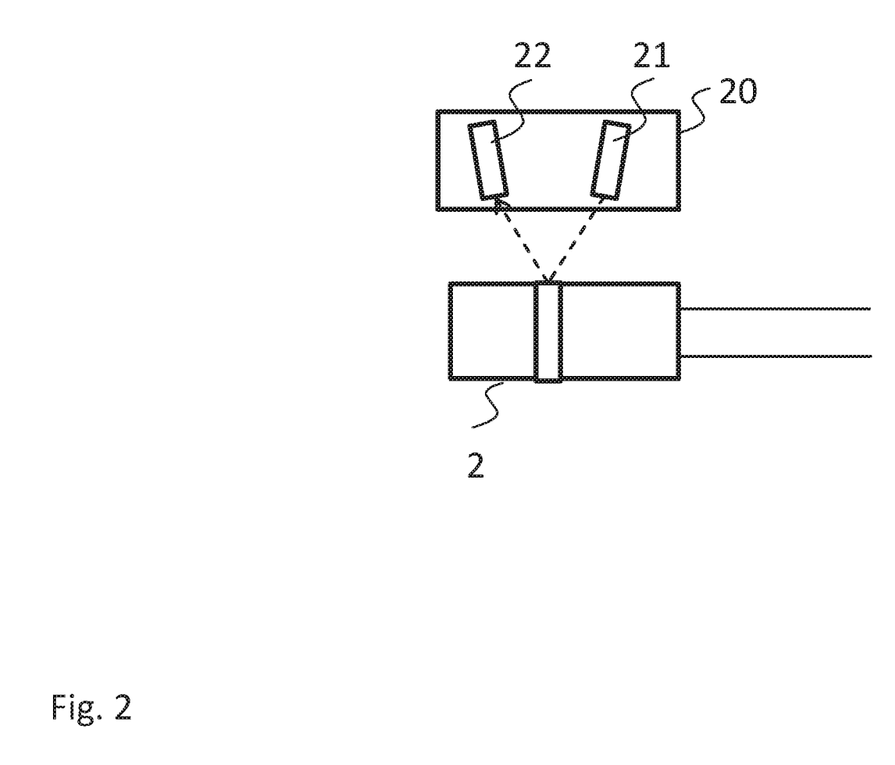
FIG. 2 shows a schematic illustration of a color detector for a measurement or inspection apparatus in accordance with one embodiment.

FIG. 2 shows a schematic illustration of a color detector 20 for a measurement or inspection apparatus 1. The color detector 20 comprises a light source 21 and an optical detector 22. The light source 21 can emit light with a predetermined wavelength spectrum or light with several separate predetermined wavelengths. The light emitted by the light source 21 is emitted in the direction of the connector device 10, in particular in the direction of a plug 2 plugged into the connector device 10, and is reflected at a predetermined position at the plug 2. Depending on the color of the predetermined position at the plug 2 separate wavelengths of the light emitted by the light source 21 are absorbed or reflected. The optical detector 22 can thereafter detect the intensity of the portion of the light reflected by the plug 2 and can determine the color at the predetermined position of the plug 2 based thereon. For example, the light source 21 can herein emit light in a predetermined wavelength spectrum or with several wavelengths simultaneously. In this case, the optical detector 22 detect's the intensity of the light reflected by the plug 2 respectively depending on the wavelength and determines the color at the predetermined position of the plug 2 based thereon. If necessary, the reflected portion of the light can also be split in its spectral portions by means of a prisma or similar, and the individual spectral portions can subsequently be analyzed by means of optical detectors. Furthermore, it is also possible that the light source 21 emits light with various wavelengths in a temporal sequence. In this case, the optical detector 22 can detect respectively the intensity of the portion of the light reflected by the plug 2. Subsequently, by assigning the detected intensity to the wavelengths emitted at the respective point in time, the color at the predetermined position of the plug 2 can also be determined. Furthermore, of course there are arbitrary other possibilities for detecting the color at the predetermined position of the plug 2. The information regarding the detected color can be provided in an arbitrary form. For example, the color can be specified as fractions of red, green and blue (RGB-values). However, also other formats for the specification of the detected color are possible.

Figure 3:
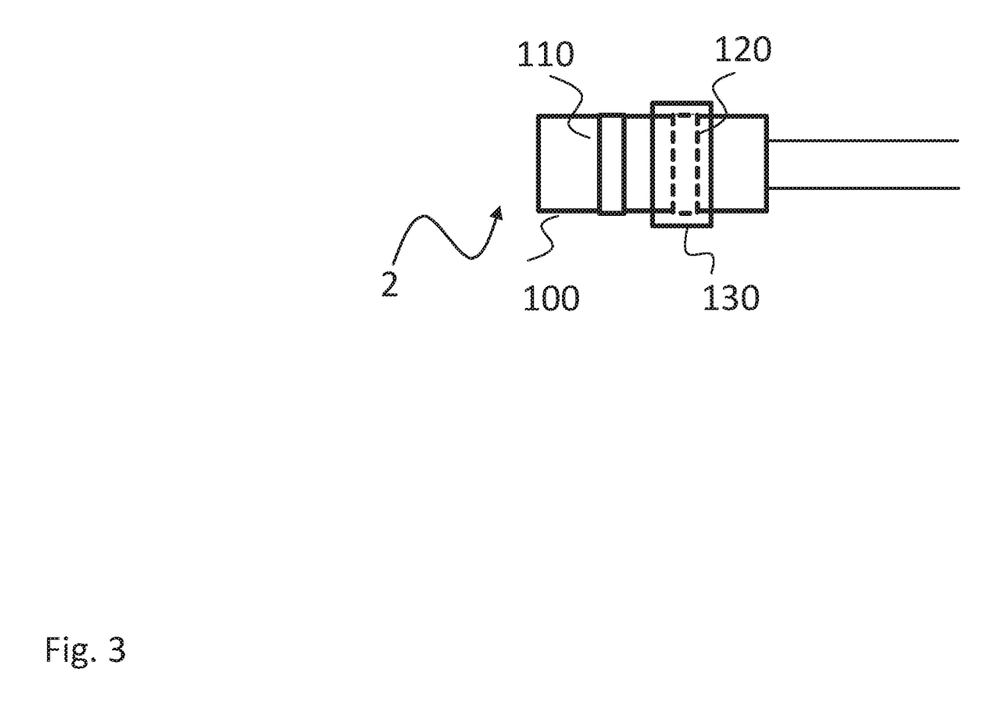
FIG. 3 show a schematic illustration of a plug connection in accordance with an embodiment.

FIG. 3 shows a schematic illustration of a plug connection 2 for a connection to a measurement or inspection apparatus 1 in accordance with one embodiment. In the example illustrated here the plug connection 2 includes a connection element 100 which exhibits a first color at a first predetermined position 110 and which exhibits a second color at a second predetermined position 120. However, the plug connection 2 is not limited to only two colors. Furthermore, it is also possible that the connection element 100 comprises more than two positions with correspondingly several different colors. Furthermore, the plug connection 2 may have a cover element 130. This cover element 130 can be arranged movable at the connection element 100. For example, the cover element 130 may be arranged on the connection element 100 such that it can be slid in the longitudinal direction. Furthermore, also arbitrary other embodiments are possible, for example a cover element rotatable along an axis or similar. Here, the cover element 130 can be moved or shifted such that one color is visible whereas the remaining colors are covered by the cover element 130. Hence, by shifting or sliding the cover element 130 one color which will be detected by the color detector 20 can respectively be set.

In particular, the plug connection 2 can further comprise a locking element (here not illustrated) which allows a secure mounting and locking of the plug connection 2 at a connector device 10 of the measurement or examination apparatus 1. By coupling the latching or locking element with the cover element 130 the color exposed by the cover element 130 can be varied dependent on the position of the locking element. For example, a first color can be exposed by the cover element 130 if the locking element is set in a position for a fixed mounting of the plug connection 2 in the connector device 10. If contrary to this the mounting by means of the locking element is released, the cover element 130 can be moved into a different position automatically, such that a different color can be exposed. The variation of the color can consequently be detected by the color detector 20. In this manner the color detector 20 can identify whether the plug connection 2 is correctly plugged into the respective connector device 10-$i$.

Figure 4:
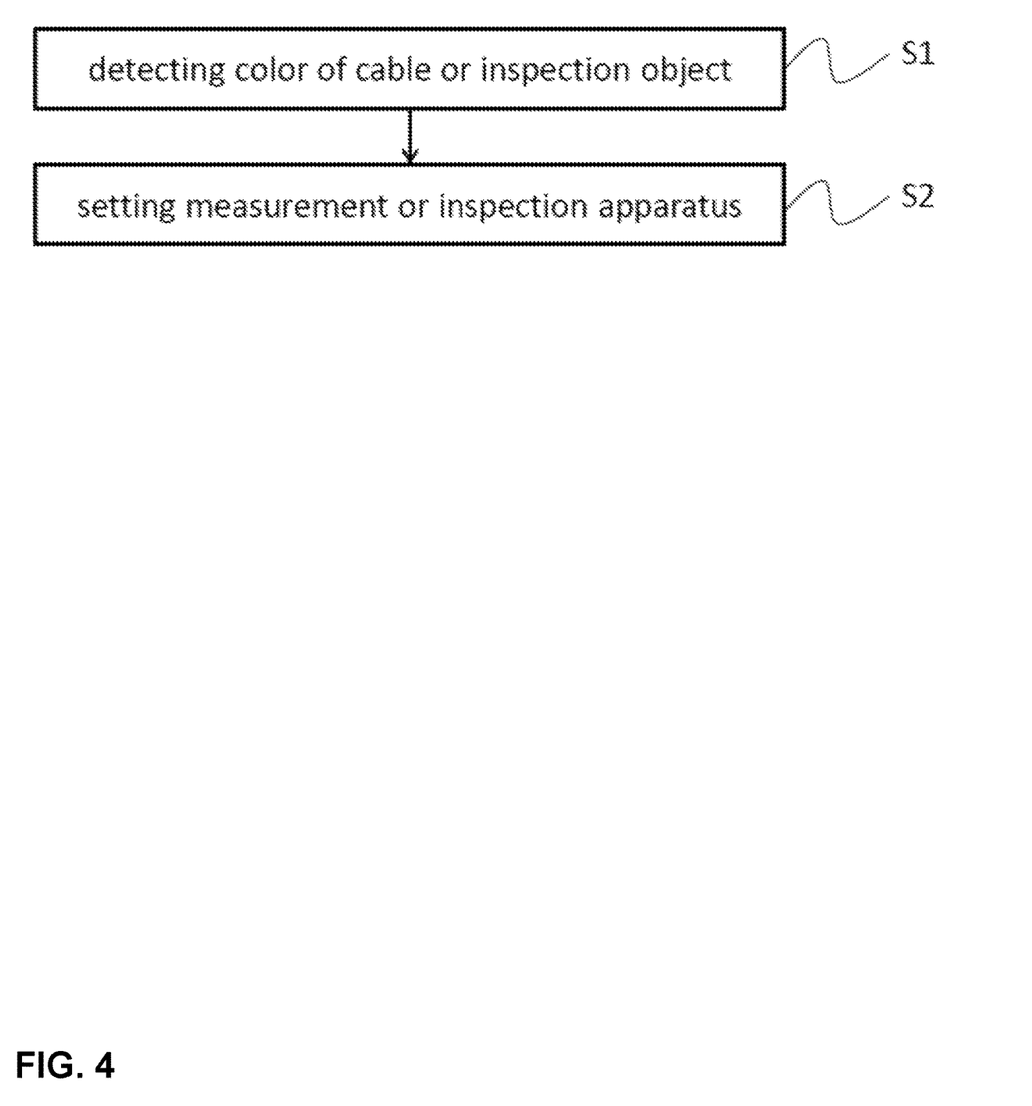

FIG. 4 shows a schematic illustration of a flowchart on which a method for setting an electrical measurement or inspection apparatus 1 in accordance with one embodiment is based. In step S1 the color of a cable or a measurement object is detected, wherein the cable or the measurement object is coupled with the measurement or inspection apparatus. Furthermore, the measurement or inspection apparatus 1 comprises a number of one or more connector devices 10-$i$, into which the respective cable or the measurement object can be plugged into. Consequently, for each connector device 10-$i$ the color of the plugged-in cable or the plugged in measurement object can be separately detected. In step S2 the measurement or inspection apparatus is set in accordance with the detected color. Herein, the setting or the configuration of the measurement or inspection apparatus can be carried out as described above.

Summarizing, the present invention relates to a measurement or examination apparatus, wherein the measurement or examination apparatus can be adjusted depending on the color of a plugged-in cable. In this manner, the display of measurement values and the color of the plugged-in cable can be coordinated to each other such that a simple assignment between measurement values and cable can be achieved.

The invention claimed is:

1. An electrical measurement or inspection apparatus, comprising:
a connector device with which a cable or an inspection object can be mechanically coupled;
a color detector which is configured to detect a color at a predetermined position of the cable or measurement object coupled with the connector device; and
a control device configured to identify a desired measurement functionality, to identify a value range of a desired measurement or information on a connected component using the color detected by the color detector, and to adjust a setting in the measurement or inspection apparatus using the color detected by the color detector,
wherein a connection of the connector device is only activated upon detecting one or more predetermined colors by the color detector.

2. The measurement or inspection apparatus of claim 1, including a display device which is adapted to display a measurement value, wherein the control device is configured to adjust the displayed measurement value dependent on the detected color.

3. The measurement or inspection apparatus of claim 1, including a measurement device which is configured to detect an electrical parameter of a measurement object coupled with the connector device, wherein the control device is configured to adjust, using the color detected by the color detector, a setting in the measurement device.

4. The measurement or inspection apparatus of claim 1, wherein the control device is configured to output an error message if the detected color match with a predetermined color.

5. The measurement or inspection apparatus of claim 1, wherein the color detector comprises a light source and an optical detector.

6. The measurement or inspection apparatus of claim 1, including a signal device which is adapted to output an optical signal, wherein the signal device adjusts the optical signal dependent on the detected color.

7. A method for setting an electrical measurement or inspection apparatus, comprising the following steps:
detecting a color of a cable or a color of an inspection object coupled with the measurement or inspection apparatus;
activating a connection of the connector device only upon detecting one or more detected colors of the cable or inspection object; and
setting the measurement or inspection apparatus dependent on the detected color, comprising identifying a desired measurement functionality, a value range of a desired measurement or information on a connected component using the color detected by the color detector, and adjusting a setting of the measurement or inspection apparatus using the detected color.

* * * * *